(12) United States Patent
Tyler et al.

(10) Patent No.: US 9,722,233 B2
(45) Date of Patent: Aug. 1, 2017

(54) BATTERY CELL SEPARATOR

(71) Applicant: Johnson Controls Technology Company, Holland, MI (US)

(72) Inventors: Matthew R. Tyler, Brown Deer, WI (US); Richard M. DeKeuster, Racine, WI (US); Dale B. Trester, Milwaukee, WI (US); Christopher M. Bonin, South Milwaukee, WI (US); Ken Nakayama, Franklin, WI (US)

(73) Assignee: Johnson Controls Technology Company, Holland, MI (US)

( * ) Notice: Subject to any disclaimer, the term of this patent is extended or adjusted under 35 U.S.C. 154(b) by 205 days.

(21) Appl. No.: 14/664,552

(22) Filed: Mar. 20, 2015

(65) Prior Publication Data

US 2016/0197321 A1 Jul. 7, 2016

Related U.S. Application Data

(60) Provisional application No. 62/100,001, filed on Jan. 5, 2015.

(51) Int. Cl.
*H01M 2/30* (2006.01)
*H01M 2/10* (2006.01)
(Continued)

(52) U.S. Cl.
CPC .......... *H01M 2/305* (2013.01); *G01R 31/362* (2013.01); *G01R 31/3658* (2013.01); *H01M 2/02* (2013.01);
(Continued)

(58) Field of Classification Search
CPC .. H01M 2/305; H01M 2/1072; H01M 10/052; H01M 2/206; H01M 2/22;
(Continued)

(56) References Cited

U.S. PATENT DOCUMENTS

| 3,717,505 A | 2/1973 | Unkle et al. |
| D489,684 S | 5/2004 | Takeshima et al. |

(Continued)

FOREIGN PATENT DOCUMENTS

| CN | 10168208 | 3/2010 |
| EP | 1059682 | 12/2000 |
| EP | 2393143 | 12/2011 |

OTHER PUBLICATIONS

PCT/US2016/013738 Search Report and Written Opinion mailed May 10, 2016.

*Primary Examiner* — Helen O Conley
(74) *Attorney, Agent, or Firm* — Fletcher Yoder, P.C.

(57) ABSTRACT

A lithium ion battery module includes a battery cell stack disposed within a housing of the battery module. The stack includes a first battery cell, a second battery cell positioned adjacent to the first battery cell, and a battery cell separator fitted over the first battery cell. The battery cell separator includes a plurality of walls formed from a continuous material and defining a pocket in which the first battery cell is disposed. The plurality of walls is configured to electrically insulate the first cell from the second cell. The separator also includes a projection extending from a wall of the plurality of walls, the projection is positioned between a terminal of the first battery cell and a terminal of the second battery cell and is configured to electrically insulate the terminals from one another.

23 Claims, 7 Drawing Sheets

(51) Int. Cl.

| | | |
|---|---|---|
| H01M 10/052 | (2010.01) | |
| H01M 2/20 | (2006.01) | |
| H01M 2/22 | (2006.01) | |
| H01M 2/32 | (2006.01) | |
| H01M 2/12 | (2006.01) | |
| H01M 10/48 | (2006.01) | |
| H01M 10/613 | (2014.01) | |
| H01M 10/625 | (2014.01) | |
| H01M 10/647 | (2014.01) | |
| H01M 10/653 | (2014.01) | |
| H01M 10/6551 | (2014.01) | |
| G01R 31/36 | (2006.01) | |
| H01M 10/0525 | (2010.01) | |
| H01M 10/42 | (2006.01) | |
| H01M 2/24 | (2006.01) | |
| H01M 10/6557 | (2014.01) | |
| H01M 2/18 | (2006.01) | |
| H01M 10/04 | (2006.01) | |
| H01M 10/058 | (2010.01) | |
| H01M 2/02 | (2006.01) | |
| H01M 2/04 | (2006.01) | |
| H01M 2/34 | (2006.01) | |
| H01M 10/02 | (2006.01) | |
| H01M 10/60 | (2014.01) | |
| H01M 10/65 | (2014.01) | |

(52) U.S. Cl.
CPC .............. *H01M 2/04* (2013.01); *H01M 2/10* (2013.01); *H01M 2/1005* (2013.01); *H01M 2/1016* (2013.01); *H01M 2/1072* (2013.01); *H01M 2/1077* (2013.01); *H01M 2/1083* (2013.01); *H01M 2/12* (2013.01); *H01M 2/1205* (2013.01); *H01M 2/1211* (2013.01); *H01M 2/1217* (2013.01); *H01M 2/1241* (2013.01); *H01M 2/1252* (2013.01); *H01M 2/1294* (2013.01); *H01M 2/18* (2013.01); *H01M 2/20* (2013.01); *H01M 2/206* (2013.01); *H01M 2/22* (2013.01); *H01M 2/24* (2013.01); *H01M 2/30* (2013.01); *H01M 2/32* (2013.01); *H01M 2/34* (2013.01); *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/653* (2015.04); *H01M 10/6551* (2015.04); *H01M 10/6557* (2015.04); *H01M 2010/4271* (2013.01); *H01M 2220/10* (2013.01); *H01M 2220/20* (2013.01)

(58) Field of Classification Search
CPC .... H01M 2/32; H01M 10/482; H01M 10/613; H01M 10/625; H01M 10/647; H01M 10/653; H01M 10/6551
See application file for complete search history.

(56) References Cited

U.S. PATENT DOCUMENTS

| | | |
|---|---|---|
| D522,965 S | 6/2006 | Nakamaru |
| 7,287,648 B2 | 10/2007 | Foreman et al. |
| D575,735 S | 8/2008 | Foreman et al. |
| D575,736 S | 8/2008 | Foreman et al. |
| D575,737 S | 8/2008 | Foreman et al. |
| D585,371 S | 1/2009 | Foreman et al. |
| D585,372 S | 1/2009 | Foreman et al. |
| 7,571,813 B2 | 8/2009 | Weisskopf |
| D624,016 S | 9/2010 | Seehoff et al. |
| D645,827 S | 9/2011 | Lee et al. |
| 8,071,234 B2 | 12/2011 | Okada et al. |
| 8,124,262 B2 | 2/2012 | Okada et al. |
| D669,435 S | 10/2012 | Moore et al. |
| D669,436 S | 10/2012 | Moore et al. |
| D688,630 S | 8/2013 | Chapman |
| D698,737 S | 2/2014 | Hagarty |
| 8,647,762 B2 | 2/2014 | Schwab et al. |
| D703,618 S | 4/2014 | Kodama et al. |
| 8,846,231 B2 | 9/2014 | Buck et al. |
| D719,529 S | 12/2014 | Hagarty |
| D724,525 S | 3/2015 | Lee et al. |
| D724,526 S | 3/2015 | Lee et al. |
| D724,527 S | 3/2015 | Lee et al. |
| D726,662 S | 4/2015 | Honda |
| D729,738 S | 5/2015 | Cole et al. |
| D731,187 S | 6/2015 | Thompson et al. |
| 9,166,425 B1 | 10/2015 | White |
| 2008/0160395 A1* | 7/2008 | Okada ............... B60L 3/0046 429/99 |
| 2008/0254359 A1* | 10/2008 | Byun ................. H01M 10/46 429/163 |
| 2009/0269657 A1* | 10/2009 | Mita ................. H01M 2/1077 429/151 |
| 2010/0136411 A1 | 6/2010 | Yoon et al. |
| 2012/0177952 A1* | 7/2012 | Maguire ............. H01M 2/1077 429/1 |
| 2012/0298433 A1* | 11/2012 | Ohkura ............. H01M 2/1077 180/65.1 |
| 2013/0252045 A1* | 9/2013 | Park ................. H01M 2/1016 429/82 |
| 2014/0220410 A1 | 8/2014 | Maguire et al. |
| 2014/0272537 A1 | 9/2014 | Kretschmar et al. |
| 2014/0329152 A1 | 11/2014 | Kouzaki et al. |

* cited by examiner

BATTERY CELL SEPARATOR

CROSS REFERENCE TO RELATED APPLICATION

This application claims priority from and the benefit of U.S. Provisional Application Ser. No. 62/100,001, entitled "MECHANICAL AND ELECTRICAL ASPECTS OF LITHIUM ION BATTERY MODULE WITH VERTICAL AND HORIZONTAL CONFIGURATIONS", filed Jan. 5, 2015, which is hereby incorporated by reference in its entirety for all purposes.

BACKGROUND

The present disclosure relates generally to the field of lithium-ion batteries and battery modules. More specifically, the present disclosure relates to battery cells that may be used in vehicular contexts, as well as other energy storage/expending applications.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As xEV technology continues to evolve, there is a need to provide improved power sources (e.g., battery systems or modules) for such vehicles. For example, it is desirable to increase the distance that such vehicles may travel without the need to recharge the batteries. Additionally, it may also be desirable to improve the performance of such batteries and to reduce the cost associated with the battery systems. Of the many considerations associated with the performance and costs of such battery systems, it is presently recognized that it may be desirable to enhance the electrical and mechanical stability of such systems, as well as the ease of manufacturing such systems. For instance, it is now recognized that it may be desirable to provide features in a battery module that are capable of providing electrical isolation between battery cells in a battery module while also providing mechanical stability to the battery cells.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, a lithium ion battery module includes a battery cell stack disposed within a housing of the battery module. The battery cell stack includes a first battery cell having a first casing and a first terminal; and a second battery cell positioned adjacent to the first battery cell and having a second casing and a second terminal; a battery cell separator fitted over the first battery cell. The battery cell separator includes a plurality of walls and a projection extending from a wall of the plurality of walls. The projection is configured to electrically insulate the first casing from the second casing. The separator also includes a projection extending from a wall of the plurality of walls, wherein the projection is positioned between the first and second terminals and is configured to electrically insulate the first terminal from the second terminal.

In another embodiment, a battery cell separator for a prismatic lithium ion battery cell includes a continuous structure, including: a first wall having a first projection; a second wall having a second projection, the first and second projections being disposed on opposing sides of the battery cell separator; and a third wall connecting the first and second walls. The first projection includes a first cutout from the third wall and the second projection includes a second cutout from the third wall, and the first and second cutouts correspond to first and second openings configured to receive first and second terminals of the prismatic lithium ion battery cell. The first, second, and third walls form a pocket configured to receive the prismatic lithium ion battery cell, and the first and second projections are such that the battery cell separator has a poka-yoke configuration that only allows one direction of planar electrical connection to be made for each of the first and second terminals of the prismatic lithium ion battery cell.

In another embodiment, a battery module includes: a housing; a stack of prismatic lithium ion battery cells disposed within the housing, the stack being such that respective faces of the prismatic lithium ion battery cells are positioned substantially parallel to one another; and a battery cell separator having a continuous structure disposed over a first prismatic lithium ion battery cell of the stack of prismatic lithium ion battery cells. The first prismatic lithium ion battery cell is disposed between two other prismatic lithium ion battery cells, and the battery cell separator electrically isolates the casing of the first prismatic lithium ion battery cell from respective casings of the two other prismatic lithium ion battery cells.

DRAWINGS

Various aspects of this disclosure may be better understood upon reading the following detailed description and upon reference to the drawings in which.

DETAILED DESCRIPTION

Figure 1:
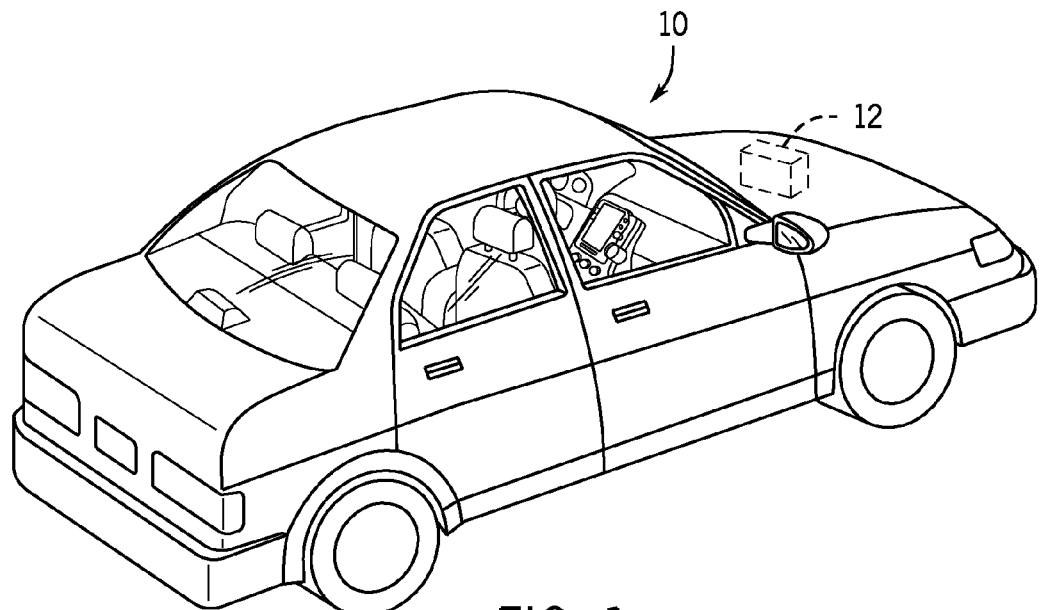
FIG. 1 is a perspective view of an xEV having a battery system configured in accordance with present embodiments to provide power for various components of the xEV, in accordance with an aspect of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to a number of different types of xEVs as well as other energy storage applications (e.g., electrical grid power storage systems). Such battery systems may include one or more battery modules, each battery module having a number of battery cells (e.g., lithium ion electrochemical cells) arranged to provide particular voltages and/or currents useful to power, for example, one or more components of an xEV. Generally, the battery cells include electrochemical materials (e.g., electrolytes, electrode active materials), which are responsible for much of the electrical activity of the battery cell. The electrochemical materials are housed within, and supported by, certain mechanical features of the cell, such has a housing of the battery cell, a current collector of the battery cell, and so forth.

In certain applications, the housing (casing) of a particular battery cell may be metallic, and may be electrically connected to one of the electrodes of the battery cell. In such configurations, the casing itself may serve as a charged terminal capable of making electrical connections to other battery cells, an electrical load, and so forth. However, in other applications, while the cell casing might be metallic (e.g., for mechanical reasons), different insulating features may be used to prevent electrical connection of the metallic casing to the electrical terminals of the battery cells. However, even with such insulating features present, some amount of charge may migrate to the casing. If two such battery cells with metallic casings are placed into contact with one another, a short may be formed. Indeed, it is now recognized that such shorts may be especially prevalent in configurations where battery cells with prismatic metallic casings are placed against one another in a "face-to-face" stack. This type of stacking configuration is shown and described in further detail below.

It is also now recognized that inadvertent shorting in stacked battery cell configurations is not necessarily limited to battery cells with metallic casings. Rather, the same or other shorts may also be prevalent in battery cells with polymeric (plastic) casings. For example, in a face-to-face stack, the terminals of adjacent battery cells may be placed into close proximity with one another. This creates an opportunity for a short to be produced by charged terminals of the battery cells contacting one another. The adjacent battery cells in a stack may, additionally or alternatively, create an opportunity for a short to be formed by causing bus bars, which may be used to electrically interconnect the battery cells in a predetermined electrical configuration (e.g., a predetermined combination of series and/or parallel battery cell connections) to be placed into close proximity with one another. In a battery module configuration having multiple battery cells subjected to a variety of forces (e.g., vibrations from a moving vehicle), the bus bars may inadvertently contact one another—thereby causing an undesired short.

A battery cell separator in accordance with the present disclosure may be incorporated into a battery module to facilitate assembly, protect against shorts, and provide a more robust battery module. More specifically, the present disclosure includes embodiments, which may be used in combination with or in lieu of any of the other embodiments disclosed herein, where a battery cell separator, configured to act as a sleeve, surrounds several sides of a battery cell of a battery cell stack. In a battery cell stack of the present disclosure, the battery cell separator (sleeve) is placed over every other cell in the stack. The separator provides electrical isolation to both sides of the battery cell.

The battery cell separator of the present disclosure may also straddle the top of the battery cell. In this regard, the separator may also include an opening to allow the vent area on the battery cell, which is positioned on the top of the battery cell, to remain uncovered.

The battery cell spacer may also provide enhanced terminal isolation. For example, the battery cell spacer may also be formed with tabs (projections), which extend beyond the top of the terminal pad on the battery cell to protect against incorrect assembly or shorts between battery cells during assembly. In this regard, the battery cell separator has a poka-yoke configuration that causes only one electrical configuration to be readily allowed (without interference) when battery cells in a stack are connected to one another using appropriate connectors (e.g., substantially planar bus bars).

As set forth above, the battery cell separator of the present disclosure may be utilized in battery modules having cell stacks. Such battery modules may be used in a variety of settings, but the embodiments set forth herein are provided in the context of a battery module used in an xEV to facilitate discussion. In this regard, the present embodiments may be further appreciated with reference to FIG. 1, which is a perspective view of an embodiment of a vehicle (e.g., xEV) 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

It is now recognized that it is desirable for a non-traditional battery system 12 (e.g., a lithium ion car battery) to be largely compatible with traditional vehicle designs. In this respect, present embodiments include various types of battery modules for xEVs and systems that include xEVs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
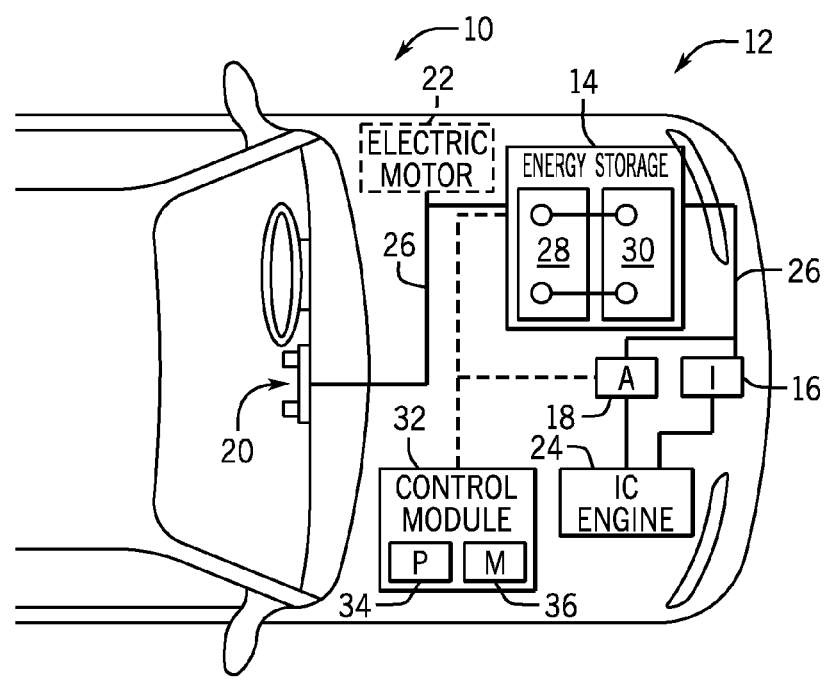
FIG. 2 is a cutaway schematic view of an embodiment of the xEV having a start-stop system that utilizes the battery system of FIG. 1, the battery system having a lithium ion battery module, in accordance with an aspect of the present disclosure.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lithium ion (e.g., a first) battery module 28 and a lead-acid (e.g., a second) battery module 30, which each includes one or more battery cells. In other embodiments, the energy storage component 14 may include any number of battery modules. Additionally, although the lithium ion battery module 28 and lead-acid battery module 30 are depicted adjacent to one another, they may be positioned in different areas around the vehicle. For example, the lead-acid battery module may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, control voltage output by the alternator 18 and/or the electric motor 22, and the like.

Accordingly, the control unit 32 may include one or processor 34 and one or more memory 36. More specifically, the one or more processor 34 may include one or more application specific integrated circuits (ASICs), one or more field programmable gate arrays (FPGAs), one or more general purpose processors, or any combination thereof. Additionally, the one or more memory 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module. Furthermore, as depicted, the lithium ion battery module 28 and the lead-acid battery module 30 are connected in parallel across their terminals. In other words, the lithium ion battery module 28 and the lead-acid module 30 may be coupled in parallel to the vehicle's electrical system via the bus 26.

Figure 3:
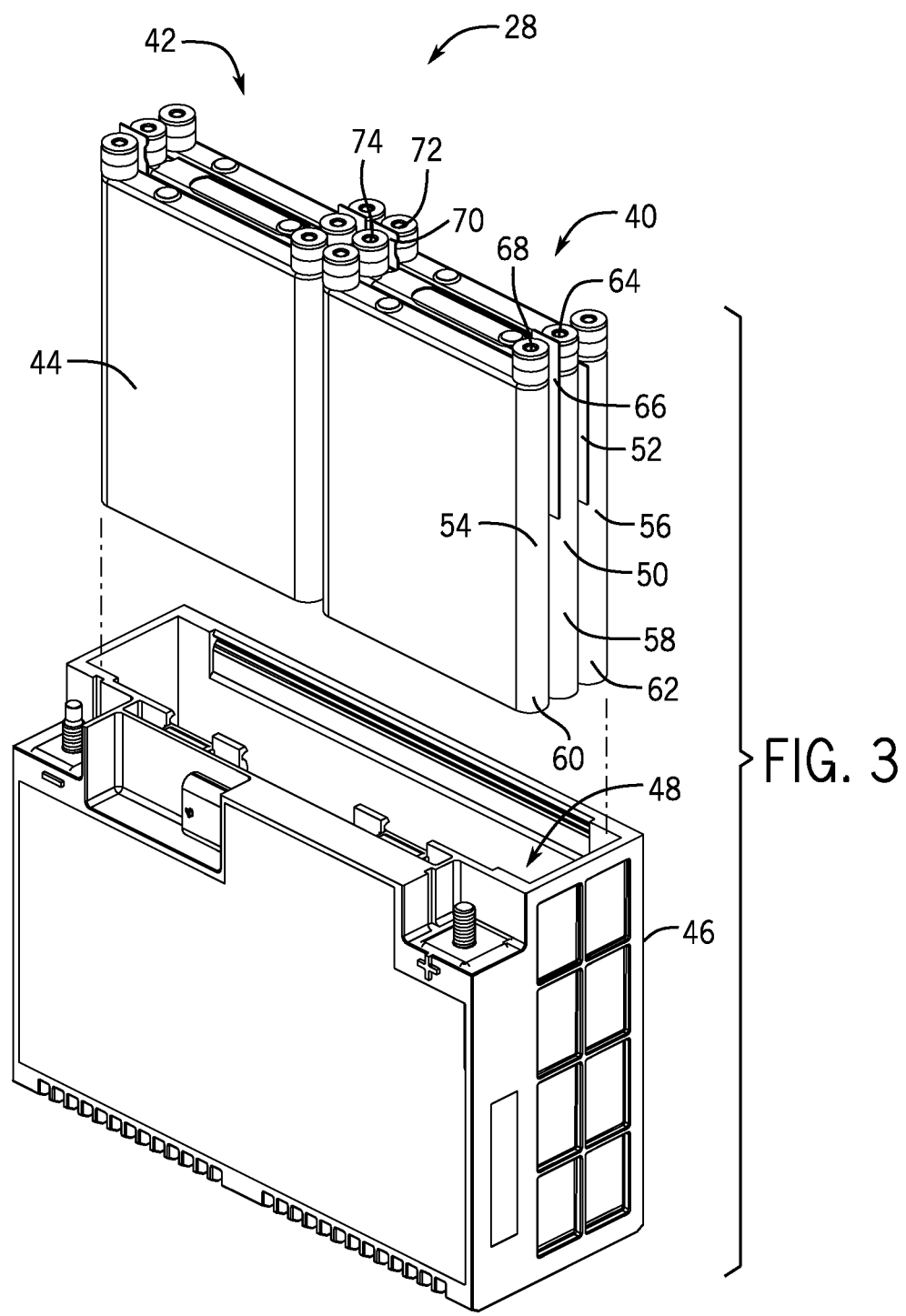
FIG. 3 is an exploded perspective view of the lithium ion battery module of FIG. 2 having a plurality of battery cells, in accordance with an aspect of the present disclosure.

As set forth above, certain embodiments of lithium ion battery modules in accordance with the present disclosure may include a plurality of battery cells, where each battery cell is isolated from an adjacent battery cell by a battery cell separator of the present disclosure. An example embodiment of the lithium ion battery module 28 is shown in FIG. 3, with certain features of the battery module 28 being removed for clarity. A first battery cell stack 40 and a second battery cell stack 42, which each include a plurality of battery cells 44, are shown as being removed from a module housing 46. When the module 28 is assembled, the battery cells 44 are positioned within a cell receptacle region 48 of the module housing 46 in a specific orientation. In the embodiment of FIG. 3, the battery cells 44 are inserted "bottom first" into the cell receptacle region 48.

As shown with respect to the first battery cell stack 40, each cell stack in accordance with the present disclosure includes at least a first battery cell 50 fitted with a battery cell separator 52, where the first battery cell 50 is positioned between a second battery cell 54 and a third battery cell 56. The battery cell separator 52, as shown, isolates a first casing (housing) 58 of the first battery cell 50 from a second casing (housing) 60 of the second battery cell 54 and a third casing (housing) 62 of the third battery cell 56. While such electrical isolation of the first casing 58, the second casing 60, and the third casing 62 may be desirable, it may also be desirable for the casings to be in thermal communication to mitigate thermal gradients within each battery cell stack. The battery cell separator 52 is configured to provide the electrical isolation noted above, and in certain embodiments may also provide thermal conductivity to reduce thermal gradients between the first casing 58, the second casing 60, and the third casing 62. Such thermal conductivity may be especially desirable in configurations where the lithium ion battery module 28 is passively cooled (e.g., not cooled using a fan or similar active cooling feature).

As also illustrated in FIG. 3, the battery cells 44 may be arranged in the first and second stacks 40, 42, such that the battery cells 44 are positioned adjacent one another in orientations where their respective terminals are positioned at the same side of a stack, and are parallel with one another in a face-to-face arrangement. To provide enhanced electrical isolation, the battery cell separators 52 disposed over the first battery cells 50 in the stacks each include a first projection 64 (e.g., a first tab) configured to isolate a first terminal 66 (e.g., first terminal pad) of the first battery cell 50 from a second terminal 68 (e.g., second terminal pad) of the second battery cell 54. Each battery cell separator 52 also includes a second projection 70 (e.g., a second tab) configured to isolate a third terminal 72 (e.g., a third terminal pad) of the third battery cell 56 from a fourth terminal 74 (e.g., a fourth terminal pad) of the first battery cell 50. In this regard, it should be noted that the use of the terms "first," "second," "third," and "fourth" with respect to the terminals is merely used for reference, and is not intended to denote or imply that the first battery cell 50 has four terminals or that the third battery cell 56 has three terminals. As described in further detail below, the projections 66, 70 may also provide electrical insulation between bus bars electrically coupled to the terminals of the battery cells 44.

Figure 4:
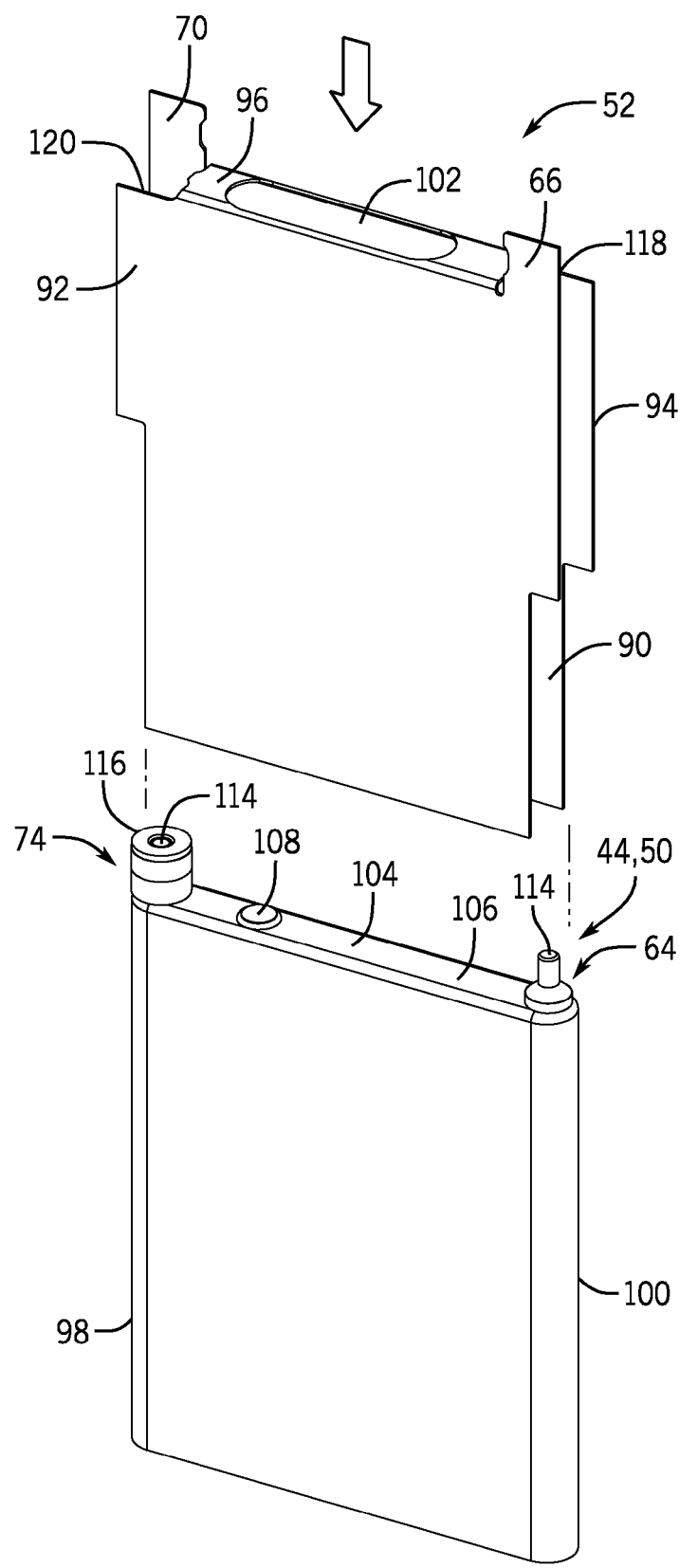
FIG. 4 is a perspective view of an embodiment of one of the battery cells of FIG. 3 separated from a battery cell separator, in accordance with an aspect of the present disclosure.

To further demonstrate the configuration of the battery cell separator 52, FIG. 4 depicts an exploded perspective view of the battery cell separator 52 away from one of the battery cells 44 (illustrated as the first battery cell 50). As illustrated, the battery cell separator 52 is a battery cell sleeve configured to envelop at least a portion of the battery cell 44, which has a prismatic casing that encloses active elements of the battery cell 44 (e.g., cell elements including one or more electrode assemblies and an electrolyte). While illustrated as being configured to partially envelop a prismatic battery cell, other embodiments of the battery cell separator 52 may be configured to fully envelop a cylindrical battery cell, a pouch battery cell, or any other suitable battery cell shape. However, it should be noted that prismatic and pouch battery cells may particularly benefit from the use of the battery cell separator 52 disclosed herein, as conductive portions (e.g., cell terminals) of such battery cells may be more susceptible to electrical contact and possible short circuit, parasitic current draw, or the like. Further, while FIG. 4 is described in the context of the first battery cell 50, it should be noted that the description is intended to be applied to any battery cell 44 sleeved with an embodiment of the battery cell separator 52. In addition, descriptions of the configuration of the first battery cell 50 itself are intended to apply to each of the battery cells 44 in the stacks 40, 42.

Generally, embodiments of the battery cell separator 52 will include a battery cell pocket 90, which is configured to receive the first battery cell 50 (e.g., only one battery cell). The battery cell pocket 90 may be sized to snugly fit over the first battery cell 50, and may include an appropriately configured material that enables some degree of stretching, flexing, etc., while still providing a desired degree of electrical insulation. Alternatively, certain embodiments of the battery cell separator 52 may be relatively hard and non-compliant. In still further embodiments, the battery cell separator 52 may be semi-rigid but have some degree of compliance to enable force redistribution, bending, flexing, etc. Example materials and resulting configurations are described in further detail below.

The battery cell separator 52 may include a plurality of walls (e.g., faces, sides), at least some of which are interconnected to form the battery cell pocket 90. In the embodiment shown in FIG. 4, the battery cell separator 52 includes a first wall 92, a second wall 94 positioned substantially opposite to the first wall 92, and a third wall 96 connecting the first and second walls 92, 94. The battery cell separator 52 may be formed from a continuous material (e.g., a single sheet of material), with appropriate cutouts corresponding to certain of the features described below.

The first and second sides 92, 94 of the battery cell separator 52 are configured to (e.g., shaped to) fit over (e.g., substantially cover) a first face 98 and a second face 100, respectively, of the first battery cell 50. The third wall 96, which may be referred to as a connecting portion, includes a vent opening 102 that enables a vent 104 of the first battery cell 50 to deploy in the event the first battery cell 50 is pressurized to a sufficient extent (e.g., due to gas generation and/or electrode swelling). While depicted as being obround, the vent opening 102 may have a geometry (e.g., shape and size) that is appropriate to enable the battery cell vent 104 to deploy, while still providing a desired degree of electrical insulation on a top 106 of the first battery cell 50. As may be appreciated with reference to the illustration in FIG. 4, the third wall 96 fits over the top 106 of the first battery cell 50, which includes not only the vent 104, but also may include an electrolyte fill hole 108 among other features (e.g., features for sealing the terminals 64, 74).

In the illustrated embodiment, the first battery cell 50 includes the first terminal 64 and the fourth terminal 74 (generally, a first terminal and a second terminal of one of the battery cells 44) both extending from the top 106 of the first battery cell 50 (e.g., through openings in the casing 58). The first and fourth terminals 64, 74 of the first battery cell 50 each include respective terminal pads, which may correspond to a terminal post 114 of the terminal, a conductive washer 116 of the terminal, or both. The terminal pad of each terminal may be considered to represent a location where an electrical connection is made between the terminal and another electrical component, such as a bus bar or similar feature. The first terminal 64 is shown with its conductive washer 116 removed to better illustrate other features of the terminal 64. Accordingly, in one embodiment, the first terminal 64 and the fourth terminal 74 both include a respective terminal post 114 and a respective conductive washer 116 or similar electrical contact. In other embodiments, only the first terminal 64 or only the fourth terminal 74 may include a respective conductive washer 116. In still further embodiments, the terminal pads of the first and fourth terminals 64, 74 may only include respective terminal posts 114.

The illustrated third wall 96 (connecting portion) of the battery cell separator 52 (sleeve) of FIG. 4 also includes a first terminal opening 118 and second terminal opening 120, which each are shaped and sized to accommodate first and second terminals of one of the battery cells 44 (illustrated as the first and fourth terminals 64, 74, respectively, of the first battery cell 50). The first and second terminal openings 118, 120 may have a geometry corresponding to the geometry of the battery cell terminals 64, 74. However, in general, the geometry of the first and second terminal openings 118, 120 may be rectangular, square, circular, elliptical, obround, and so forth, and may or may not depend on the geometry of the battery cell terminals 64, 74. For instance, in an embodiment, the battery cell terminals 64, 74 may be square, in which case the terminal openings 118, 120 of the battery cell separator 52 may also have a correspondingly square geometry. However, the present disclosure also includes embodiments where the terminal openings 118, 120 of the battery cell separator 52 have a geometry that does not minor the geometry of the battery cell terminals 64, 74. In still further embodiments, a common geometry may be defined for the terminal openings 118, 120 so that the battery cell separator 52 is capable of being used with a number of different battery cell configurations (e.g., different prismatic battery cell configurations). For instance, the terminal openings 118, 120 may have a configuration that is appropriate for a number of different standardized (and/or non-standardized) terminal sizes, shapes, and forth.

The first and second terminal openings 118, 120 of the battery cell separator 52 may be considered to be cutouts from the third wall 96, and may be shaped to enable certain connecting features of the battery module (e.g., bus bars) to interface with the cell terminals 64, 74 while blocking others. The cutouts from the third wall 96 may be produced in such a way to produce the first projection 66 (e.g., first tab) and the second projection 70 (e.g., second tab). As described above with respect to FIG. 3, the first and second projections 66, 70 are configured to block certain connecting features, as well as the terminals 64, 74 themselves, from physically contacting certain other terminals and certain other connecting features, which could create a short. This configuration may be further appreciated with reference to the illustration in FIG. 5.

Figure 5:
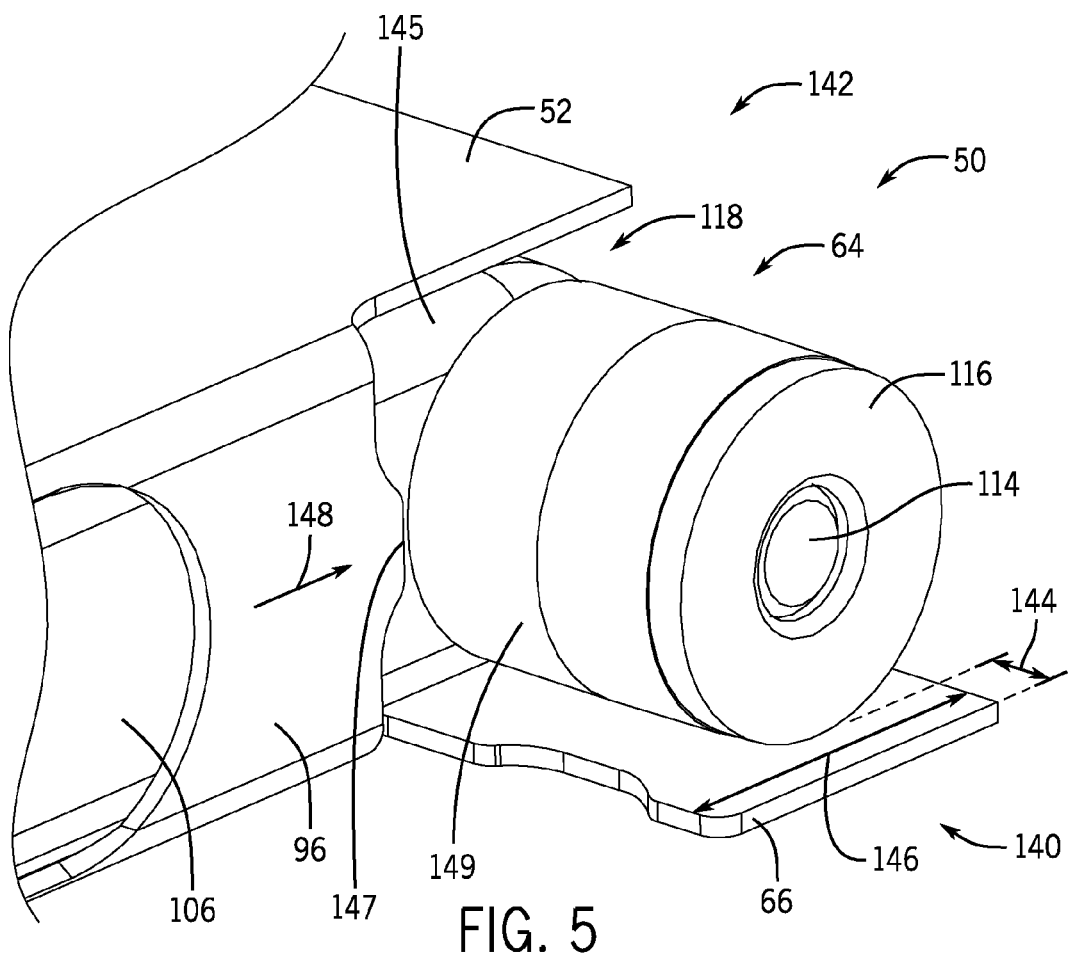
FIG. 5 is an expanded and partial cutaway view of a battery cell of FIG. 3 having a battery cell separator positioned thereover, in accordance with an aspect of the present disclosure.

In FIG. 5, the first projection 66 is positioned on a first side 140 of the first terminal 64 (e.g., substantially parallel to the first face 98 of the first battery cell 50), which blocks electrical connections from being made with the terminal pad (e.g., the terminal post 114 and/or the conductive washer 116) of the first battery cell 50 from the first side 140. That is, the first projection 66 provides physical interference on the first side 140, which may resist electrical connection or at least provide an indication to an operator that an electrical connection should not be made from the first side 140. On the other hand, the battery cell separator 52 does not have a projection disposed on a second side 142 (e.g., substantially parallel to the second face 100 of the first battery cell 50), which enables electrical connections to be made with the terminal pad of the battery cell 44 from the second side 142 without physical interference from the first projection 66.

As illustrated with respect to the first projection 66, the projections may have a geometry that corresponds to their respective terminal opening (e.g., first terminal opening 118 for the first projection 66), and blocks the conductive washer 116 and the terminal post 114 from a particular side (the first side 140 for the first projection 66), with an additional length 144 extending beyond an endmost tip of the terminal pad (which may be the terminal post 114 or the conductive washer 116, depending on the configuration of the battery cell). The additional length 144 may be sufficient to block contact between an electrical connection feature (e.g., a first bus bar) disposed on the second side 142 and coupled to the first terminal 64 and another electrical connection feature (e.g., a second bus bar) disposed on the first side 140 and coupled to an adjacent terminal. For example, the additional length 144 may be substantially equal to or greater than a thickness of a bus bar coupled to the first terminal 110. However, in other embodiments, the additional length 144 may be substantially equal to or less than a thickness of the bus bar.

As noted above, the first projection 66 has a geometry that corresponds to the geometry of the first terminal opening 118. Accordingly, it should be appreciated that the additional length 144 may depend on the size of the first terminal opening 118. In this regard, the first terminal opening 118 is sized to leave a curvature 145 on the top 106 of the first battery cell 50 exposed, and the additional length 144 may therefore be sized according to the size of the curvature 145. In one embodiment, the additional length 144 may be substantially the same dimension as the curvature 145.

In addition, because the first opening 118 is sized to receive the first terminal 110, the first projection 66 may have a width 146 that is sized to cover the first side 140 of the first terminal 110. Also, as illustrated, the width 146 of the first projection 66 may vary through its length. In the illustrated embodiment, the width 146 of the first projection 66 varies in its length direction due to the presence of a terminal abutment tab 147 on the third wall 96. The terminal abutment tab 147 may be configured to abut the first terminal 110 to, for example, resist lateral movement of the separator 52. For example, if the separator 52 were to be displaced in lateral direction 148 with respect to the battery cell 50, the terminal abutment tab 146 would contact a feature of the first terminal 110 (e.g., a terminal washer 149), thereby preventing significant displacement of the first projection 66 and potential misalignment of the first projection 66 with the first terminal 110.

Figure 6:
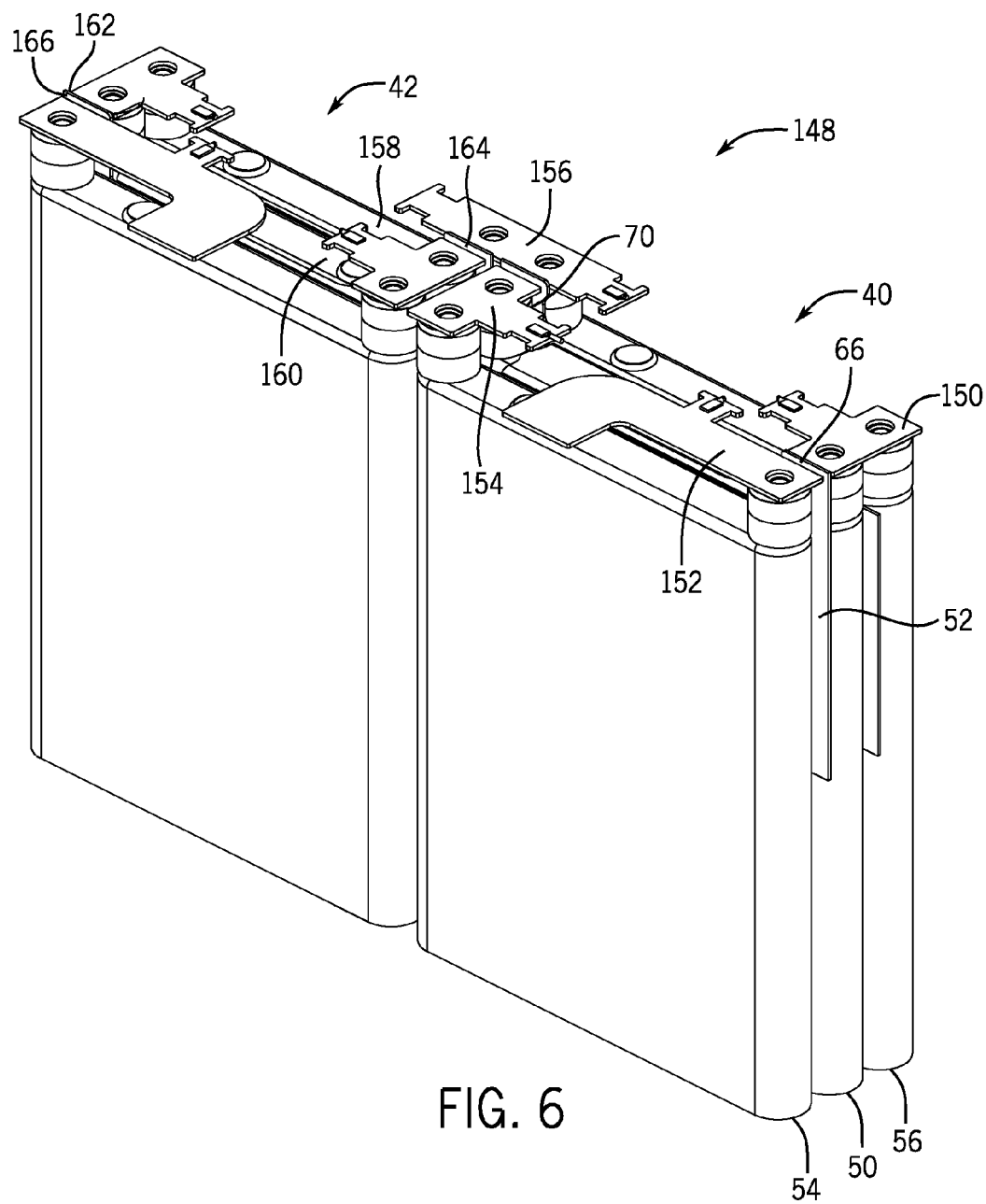
FIG. 6 is a perspective view of a battery cell assembly formed by electrically interconnecting the battery cell stacks of FIG. 3, in accordance with an aspect of the present disclosure.

The electrical isolation between bus bars may be further appreciated with reference to FIG. 6, which is a perspective view of the first and second cell stacks 40, 42 of FIG. 3, removed from the housing 46, and electrically coupled into a cell assembly 148 via a series of bus bars. As shown in FIG. 6, a single battery cell separator 52 (e.g., sleeve) fitted over a middle battery cell (the first battery cell 50) may help establish an appropriate electrical pathway, for example during battery module assembly. The electrical pathway facilitated by the presently disclosed battery cell separators may be a serial electrical pathway (i.e., enabling cells to be connected in series), a parallel electrical pathway (i.e., enabling cells to be connected in parallel), or a combination of both, depending on the particular arrangement of the projections 66, 70 relative to the first, second, and third walls 92, 94, 96 of the battery cell separator 52 and the manner in which the battery cells 44 are arranged.

In FIG. 6, for example, the battery cell separator 52, when fitted over the first (middle) battery cell 50, may generally block a first bus bar 150 connecting the first battery cell 50 to the third battery cell 56 from contacting a second bus bar 152 connecting the second battery cell 54 to another electrical feature (e.g., a battery module terminal) using the first projection 66. Indeed, in a general sense, the projections of the battery cell separator 52 may electrically isolate adjacent bus bars from one another. As a further example, the second projection 70 electrically isolates a third bus bar 154 electrically connecting the first battery cell 50 to the second battery cell 54 from a fourth bus bar 156 adjacent to the third bus bar 154 and electrically connecting the third battery cell 56 of the first stack 40 to a corresponding third battery cell (illustrated as fourth battery cell 158) of the second stack 42, which is adjacent to the first stack 44.

In view of the foregoing, it should be appreciated that the battery cell separators 52 of the present disclosure provide isolation (e.g., electrical separation) between battery cell casings, battery cell terminals, and battery cell interconnecting bus bars. This separation is configured to enable a predetermined battery cell assembly to be produced reliably and without inadvertent electrical connections being made. The predetermined battery cell assembly may have a predetermined number and pattern of serial and/or parallel connections between the cells of the first stack 40, the second cell stack 42, or both. As an example and as set forth above with respect to FIG. 3, the first projection 66 would block ready connection, using the first bus bar 150, between the first terminal 64 of the first cell 50 and the second terminal 68 of the second cell 54. Likewise, the second projection 70 would block ready connection, using the third bus bar 154, between the third terminal 72 of the third cell 56 and the fourth terminal 74 of the first cell 50.

In this way, the battery cell separator 52 may be considered to have a "poka-yoke" configuration that causes only one electrical configuration to be readily formed (e.g., allowed) when the first, second, and third battery cells 50, 54, 56 are electrically connected to one another using adjacent bus bars or similar connectors. More specifically, the first and second projections 66, 70 cause the battery cell separator 52 to have a poka-yoke configuration that only allows one direction of planar electrical connection to be made for each of the terminals (the first terminal 64 and the fourth terminal 74) of the first battery cell 50.

As shown, the second stack of battery cells 42 (which is disposed within the housing 46 and adjacent the first stack 40 when the module 28 is assembled) includes a corresponding middle battery cell (e.g., a fifth battery cell 160) that is fitted with an additional battery cell separator 162 in an arrangement where the battery cells of the second stack 42 have their respective faces positioned substantially parallel to one another. The additional battery cell separator 162 includes a respective first projection 164 and a respective second projection 166. As may be appreciated by their illustrated positioning relative to one another and relative to the battery cells 44 in the second stack 42, the projections 164, 166 are formed so that the additional battery cell separator is a minor image of the battery cell separator 52 described above.

Figure 7:
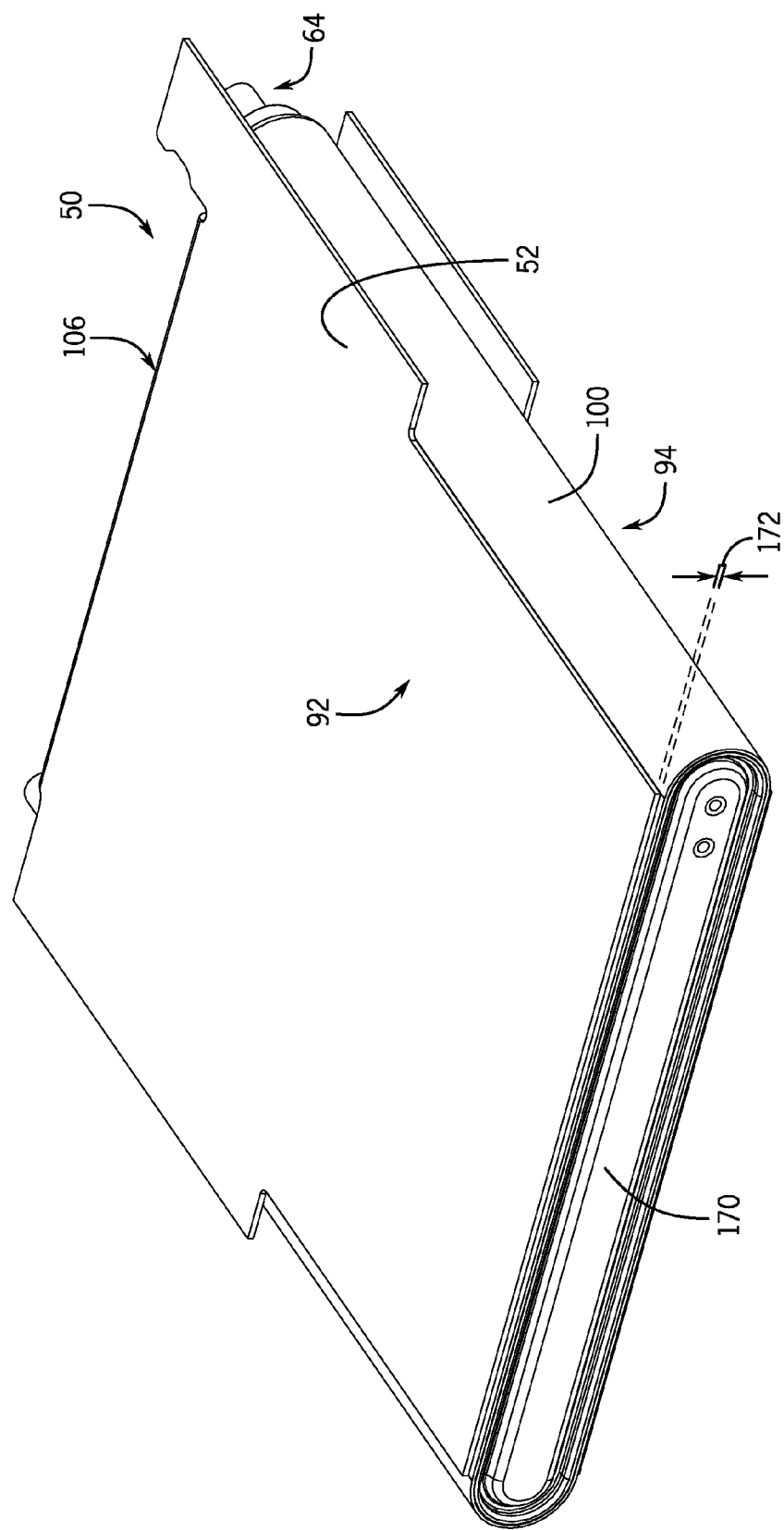
FIG. 7 is a perspective view of a battery cell fitted with a battery cell separator and illustrating an uncovered bottom of the cell, in accordance with an aspect of the present disclosure.

As set forth above with respect to FIG. 3, while the battery cell separator 52 blocks electrical contact between adjacent cells and between certain cell terminals, it may also enable a bottom of the battery cells to contact (e.g., directly contact) an interior surface of the battery module housing 46 for passive cooling. As shown in the perspective view of FIG. 7, the first battery cell 50 is covered by the first wall 92, the second wall 94, and the third wall 96 of the battery cell separator 52, but a bottom 170 of the first battery cell 50 is left open to interface with other features. For example, in one embodiment, a thermal interface feature (e.g., polymer layer) may be placed between the bottom 170 of the battery cell 50 and an internal surface of the battery module housing 46 to facilitate heat transfer between the battery cell 50 and the module housing 46 (and, for example, cooling features thereof).

As another example, an adhesive may be applied to the bottom 170 of the first battery cell 50 to enable adhesive securement to the module housing 46. In such embodiments, the adhesive may already be positioned within the module housing 46 before application to the bottom 170 of the cell 50 (e.g., the adhesive is applied to the bottom 170 when the first battery cell 50 is positioned against an internal surface of the battery module housing 46). In other embodiments, the adhesive may be applied to the bottom 170 before introduction of the cell 50 into the housing 46.

Because the battery cell separator 52 may be disposed over only a few surfaces of the battery cell 50 in certain embodiments, it may be desirable to secure the separator 52 to the battery cell 50 using additional features. For example, the battery cell separator 52 may be backed with an adhesive layer to facilitate attachment to the particular battery cell that is ultimately surrounded by the separator 52. That is, an adhesive may be positioned between the casing 58 of the first battery cell 50 and an internal surface of the separator 52.

The adhesive layer may be supported or unsupported, depending on spatial and thermal constraints. Additionally or alternatively, an adhesive layer may be positioned on an outer surface of the battery cell separator 52 to adhesively couple adjacent battery cells 44 within a stack (e.g., to couple the battery cells 44 of the first stack 42).

With the benefit of the present disclosure, it should be appreciated that the presently disclosed battery cell separator 52 may have a variety of configurations depending on the manner in which the battery cell separator 52 will be used. Indeed, other modifications to the battery cell battery cell separator 52 may be configured to enable the battery cell separator 52 to perform additional functions. As one example, channels may formed into the first and/or second walls 92, 94 of the battery cell separator 52 to enable cooling fluid (e.g., air) to pass over predetermined portions of the battery cell 50 and/or adjacent battery cells (e.g., second and third battery cells 54, 56), for example along predetermined pathways. In one embodiment, the channels may direct cooling fluid to a face of the battery cell 50 that is expected to experience the highest temperature increase, thermal stresses, and so forth.

Generally, the battery cell battery cell separator 52 of the present disclosure may be produced using a variety of material constructions suitable to enable electrical isolation/insulation with respect to the exposed conductive elements of the battery cells. For instance, the battery cell separators 52 disclosed herein may include one or a combination of materials of sufficient dielectric properties so as to prevent shorts from being formed across the material of the battery cell separator 52. As an example, such materials may include elastomers, thermoplastics, thermosets, polyimides, poly (ethylene terephthalate) (PET), or a similar material.

In some embodiments, the battery cell separators 52 disclosed herein may be compliant and stretchable over the battery cells 44. For example, in embodiments where the sleeve is configured to fit snugly over a battery cell, the battery cell sleeve may include an elastomer (e.g., polybutadiene), a thermoplastic elastomer, or any other compliant and/or stretchable material, or a combination thereof.

Alternatively, the battery cell separators 52 may be made of a slightly compliant material, but may not be configured to stretch to any appreciable extent. In such embodiments, the battery cell separators 52 may be made from a polyolefin (e.g., polyethylene, polypropylene), a polyarene (e.g., polystyrene, polyphenylene sulfide), or the like. In a further embodiment, the battery cell separators 52 may be made of a harder material that is relatively inflexible, such as a thermosetting resin.

Furthermore, the battery cell separators 52 disclosed herein may, in some embodiments, include a filler material enabling or causing anisotropic electrical and/or thermal conduction. For example, the battery cell separators 52 may include nanomaterials such as metallic, semi-metallic, or carbon-based nanoparticles, nanotubes, nanofibers, sheets or layers of graphene, or the like. Further, certain fillers may be used to provide enhanced structural characteristics. In addition to or in lieu of conductive fillers, structural fillers may be used, such as fibers, beads, granules, or the like, of a ceramic material, such a silicate or borosilicate glass, or any other suitable material.

In addition to the material properties of the battery cell separators 52, their dimensions may also be appropriately sized to provide suitable electrical and/or thermal performance. For example, if the walls of the battery cell separator 52 are too thin, insufficient electrical insulation may result. On the other hand, if the walls of the battery cell separator 52 are too thick, insufficient thermal transfer may occur. Even in situations where thermal gradients are not a substantial consideration from the standpoint of the battery cell separator 52, if the walls are too thick, there may be insufficient room within the battery cell receptacle region 48 to fit all the battery cells 44 with the battery cell separator 52. Accordingly, the walls of the battery cell separator 52 may have a thickness 172 sufficient to provide desirable electrical insulation and, in some embodiments, thermal management. By way of non-limiting example, the thickness 172 may be between approximately 0.25 mm and approximately 1.0 mm, such as between approximately 0.5 mm and approximately 0.8 mm. As one example, the thickness 172 may be approximately 0.75 mm.

In accordance with certain embodiments of the present disclosure, the battery cell separator 52 may be formed from a single, flat sheet and appropriately sized and positioned cutouts to produce the walls, protrusions, and openings described above. Moving now to FIG. 8, an overhead plan view of a sheet 180 of material that is used to produce an embodiment of the battery cell separator 52 is shown. More specifically, the sheet 180, which may include any one of or a combination of the materials set forth above, may be cut to remove portions of the sheet 180 corresponding to the terminal openings 118, 120 and the vent opening 102 described above with respect to FIG. 4, and folded to delineate the first, second, and third walls 92, 94, 96 from one another.

Figure 8:
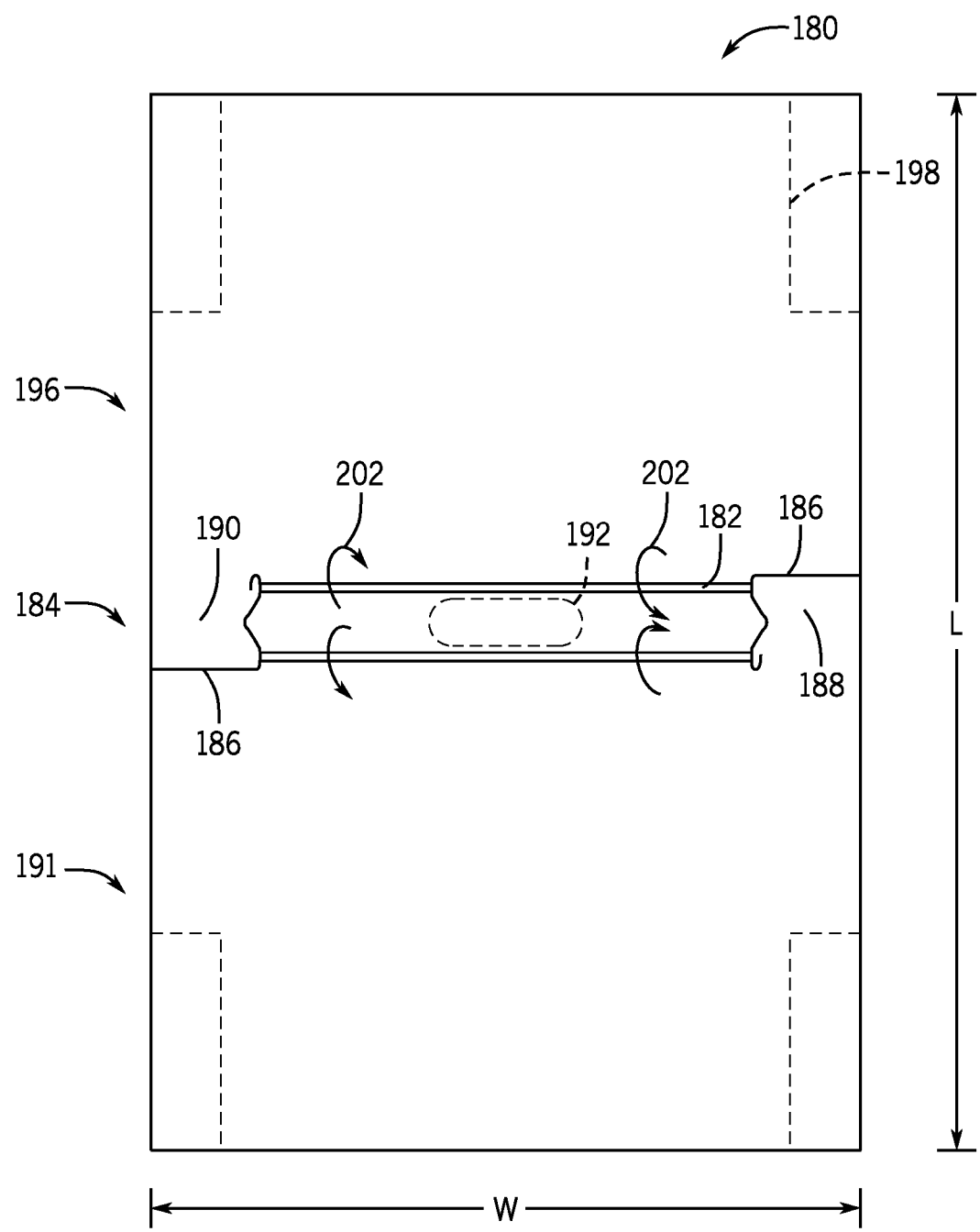
FIG. 8 is an overhead plan view of a sheet that is cut and folded to produce an embodiment of a battery cell separator, in accordance with an aspect of the present disclosure.

As shown in FIG. 8, the sheet 180 is depicted in combination with fold lines 182, which bound, in a length direction L of the sheet 180, a region 184 corresponding to the third wall 96 of the battery cell separator 52 (e.g., the connecting portion of the separator 52). The illustration of FIG. 8 also includes a series of cut lines 186 bounding the region 184 in a width direction W of the sheet 180. The cut lines 186 also produce the first and second protrusions 64, 70 of the battery cell separator 52 when the sheet 180 is appropriately folded. That is, a first section 188 of the region 184 generally corresponding to the position of one protrusion and a second section 190 of the region 184 generally corresponding to another protrusion may be cut so that when the sheet 180 is folded, such as to include creases corresponding to edges of the third wall 96 at the fold lines 182, protrusions arise from a discontinuity in the sheet 180 produced by the cuts 186. The region 184 also includes a cutout line 192, which corresponds to the vent opening 102 of FIG. 4.

Additionally, the region 184 couples a first additional region 194 and a second additional region 196, and is considered to be separated from these regions by the fold lines 182. The first additional region 194 and the second additional region 196 may be considered to correspond to the first and second walls 92, 94 of the battery cell separator 52. The first and second additional regions 194, 196 may also have cutouts 198 to produce the geometry shown in FIG. 4.

As shown, the battery cell separator 52, and its minor image (the additional battery cell separator 162 of FIG. 6) may be produced from the same sheet 180 and using the same cutouts using different folding directions. For example, a first fold direction 200 (into the page) of the first and second additional regions 194, 196 causes the battery cell separator 52 to be produced by causing the first additional region 194 to correspond to the first wall 92 and the second additional region 196 to correspond to the second wall 94.

Alternatively, a second fold direction 202 (upwardly from the page) of the first and second additional regions 194, 196 causes the additional battery cell separator 162 to be produced by causing the first additional region 194 to correspond to a second wall of the additional battery cell separator 162 and the second additional region 196 to correspond to a first wall of the additional battery cell separator 162. Other ways of producing the battery cell separators of the present disclosure are also within the scope of the present disclosure, including other ways in which the sheet 180 may be cut, folded, and so forth. Further, the battery cell separators need not be produced from a single sheet of material, and/or the separators need not be formed from a homogenous material.

The battery cell separator 52 may use any one or a combination of the material compositions noted above, and the material composition of the battery cell separator 52 does not necessarily need to be homogeneous throughout the entire sleeve, but may be homogenous throughout the entire sleeve in certain embodiments. As an example, certain portions of the battery cell separator 52 may be stretchable, such as the first and second walls 92, 94 (see FIG. 4) of the separator 52, while the projections 64, 70 (see FIG. 4) may be relatively hard compared to the walls. Dissimilar walls may also be combined to produce the battery cell separator 52. For example, walls or sheets of different materials (e.g., polymer materials) may be coupled to one another adhesively or using another appropriate method to produce certain embodiments of the battery cell separator 52.

The embodiments disclosed herein may be used in any suitable combination, and the present disclosure is intended to encompass any combination of any of the embodiments disclosed herein. As an example, one or more of the disclosed embodiments, in any combination, may be used to provide the technical effect of electrically isolating a battery cell from other battery cells positioned immediately adjacent to the battery cell. For example, a battery cell separator may be in the form of a battery cell sleeve having a pocket configured to receive a battery cell. The pocket may be defined by a series of connected walls of the sleeve, and the walls are configured to electrically insulate a casing of the battery cell from respective casings of the adjacent battery cells. Further, projections of the battery cell sleeve may provide the technical effect of electrically isolating certain terminals of the battery cell from certain other terminals of the adjacent battery cells.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A battery module, comprising:
   a battery cell stack disposed within a housing of the battery module;
     a first battery cell of the battery cell stack comprising a first casing and a first terminal; and
     a second battery cell of the battery cell stack positioned adjacent to the first battery cell and comprising a second casing and a second terminal;
   a battery cell separator fitted over the first battery cell, wherein the battery cell separator comprises a plurality of walls and a projection extending from a wall of the plurality of walls:
     wherein the plurality of walls is formed from a continuous material and defines a pocket in which the first battery cell is disposed, and the plurality of walls is configured to electrically insulate the first casing from the second casing;
     wherein the plurality of walls of the battery cell separator comprises a first wall, a second wall, and a third wall connecting the first and second walls, wherein the second wall is disposed opposite to the first wall, wherein the third wall is disposed over a terminal side of the first battery cell, the first terminal extending from the terminal side;
     wherein the first wall of the battery cell separator is disposed between a face of the first casing of the battery cell and a face of the second casing of the second battery cell and separates the face of the first casing from the face of the second casing; and
     wherein the projection is positioned between the first and second terminals and is configured to electrically insulate the first terminal from the second terminal.

2. The battery module of claim 1, wherein the projection extends from the first wall and comprises a cutout of the third wall.

3. The battery module of claim 1, wherein the third wall comprises an opening corresponding to a position of a vent disposed on the terminal side of the first casing of the first battery cell.

4. The battery module of claim 1, wherein the battery cell stack comprises a third battery cell disposed adjacent to the first battery cell and comprising a third casing and a third terminal, and wherein the second wall of the battery cell separator is disposed against another face of the first casing of the first battery cell and a face of the third casing of the third battery cell.

5. The battery module of claim 4, wherein the first battery cell comprises a fourth terminal extending from the top of the first casing, wherein the battery cell separator comprises an additional projection extending from the second wall and comprising an additional cutout of the third wall, and the additional projection electrically isolates the fourth terminal from the third terminal.

6. The battery module of claim 5, wherein the projections extending from the first and second walls are disposed at opposite sides of the third wall.

7. The battery module of claim 5, wherein the third terminal is electrically connected to the first terminal, the second battery cell comprises a fifth terminal, and the fourth terminal is electrically connected to the fifth terminal.

8. The battery module of claim 1, wherein the battery cell stack comprises a third battery cell disposed adjacent to the first battery cell such that the first battery cell is disposed between the second and third battery cells, and the battery cell separator has a poka-yoke configuration that causes only one electrical configuration to be allowed when the first, second, and third battery cells are electrically connected to one another using co-planar connectors.

9. The battery module of claim 1, wherein the wall of the plurality of walls and the projection extending from the wall have a first combined length that is greater than a second combined length of the first battery cell, the second combined length being a length as measured from a bottom of the first battery cell and to a tip of a terminal pad of the first terminal.

10. The battery module of claim 9, comprising a bus bar electrically connecting the first terminal of the first battery cell to a terminal of another battery cell, and the first combined length is at least as long as a third combined length corresponding to the second combined length and a thickness of the bus bar.

11. The battery module of claim 1, wherein the first and second casings are metallic prismatic casings, and the battery cell separator is polymeric and is a dielectric relative to the first and second casings.

12. The battery module of claim 1, wherein the battery cell separator comprises an adhesive disposed on the first wall and coupled to a face of the second battery cell.

13. The battery module of claim 1, wherein the plurality of walls of the battery cell separator do not cover a bottom of the first battery cell, and the bottom of the first battery cell is disposed against a thermal transfer medium, the thermal transfer medium being disposed against an interior surface of the battery module, and the bottom is positioned substantially opposite of the terminal side.

14. The battery module of claim 13, wherein the thermal transfer medium comprises a thermally conductive adhesive.

15. The battery module of claim 1, wherein the battery cell separator is coupled to the first casing of the first battery cell with an adhesive.

16. A battery cell separator for a prismatic lithium ion battery cell, the battery cell separator comprising:
a continuous structure, comprising:
a first wall comprising a first projection;
a second wall comprising a second projection, the first and second projections being disposed on opposing sides of the battery cell separator; and
a third wall connecting the first and second walls, wherein the first projection comprises a first cutout from the third wall and the second projection comprises a second cutout from the third wall, and the first and second cutouts correspond to first and second openings configured to receive first and second terminals of the prismatic lithium ion battery cell;
wherein the first, second, and third walls form a pocket configured to receive the prismatic lithium ion battery cell, and the first and second projections are such that the battery cell separator has a poka-yoke configuration that only allows one direction of planar electrical connection to be made without interference for each of the first and second terminals of the prismatic lithium ion battery cell; and
wherein the second wall is disposed opposite to the first wall, wherein the first wall is configured to be disposed between a face of the prismatic lithium ion battery cell and a face of an adjacent prismatic lithium ion battery cell and separate the face of the prismatic lithium ion battery cell from the face of the adjacent prismatic lithium ion battery cell.

17. The battery cell separator of claim 16, wherein the third wall is oriented substantially orthogonal to the first and second walls.

18. The battery cell separator of claim 16, wherein the third wall comprises an opening positioned between the first and second cutouts and corresponding to a position of a vent positioned at a top of the prismatic lithium ion battery cell.

19. The battery cell separator of claim 16, wherein the third wall is dimensioned to correspond to a top of a casing of the prismatic lithium ion battery cell.

20. The battery cell separator of claim 16, wherein a terminus of the first cutout and a terminus of the second cutout correspond to positions of first and second folds, respectively, the first and second folds cause the third wall to be oriented crosswise relative to the first and second walls.

21. The battery cell separator of claim 16, wherein the continuous structure comprises a single sheet of poly(ethylene terephthalate).

22. The battery module of claim 12, wherein the plurality of walls of the battery cell separator does not cover a bottom of the first battery cell, wherein the bottom is disposed opposite to the top of the first battery cell.

23. The battery module of claim 5, wherein a terminus of the cutout of the third wall and a terminus of the additional cutout of the third wall correspond to positions of first and second folds, respectively, the first and second folds cause the third wall to be oriented crosswise relative to the first and second walls.

* * * * *

UNITED STATES PATENT AND TRADEMARK OFFICE
CERTIFICATE OF CORRECTION

PATENT NO. : 9,722,233 B2  
APPLICATION NO. : 14/664552  
DATED : August 1, 2017  
INVENTOR(S) : Matthew R. Tyler et al.

Page 1 of 3

It is certified that error appears in the above-identified patent and that said Letters Patent is hereby corrected as shown below:

In the Drawings

1. In Fig. 8, Sheet 7 of 7, delete Tag "191", and insert Tag --194--, therefor.

2. In Fig. 8, Sheet 7 of 7, delete the second occurrence (rightmost occurrence) of "202" and insert --200--, therefor.

In the Specification

3. In Column 7, Lines 16-17, delete "one or processor" and insert --one or more processor--, therefor.

4. In Column 8, Line 25, delete "projections 66, 70" and insert --projections 64, 70--, therefor.

5. In Column 9, Line 28, delete "terminals 64, 74)." and insert --terminals 66, 74).--, therefor.

6. In Column 9, Line 30, delete "first terminal 64" and insert --first terminal 66--, therefor.

7. In Column 9, Line 34, delete "terminals 64, 74" and insert --terminals 66, 74--, therefor.

8. In Column 9, Line 41, delete "first terminal 64" and insert --first terminal 66--, therefor.

9. In Column 9, Line 43, delete "terminal 64." and insert --terminal 66.--, therefor.

10. In Column 9, Lines 43-44, delete "first terminal 64" and insert --first terminal 66--, therefor.

11. In Column 9, Line 47, delete "first terminal 64" and insert --first terminal 66--, therefor.

12. In Column 9, Line 50, delete "terminals 64, 74" and insert --terminals 66, 74--, therefor.

13. In Column 9, Line 57, delete "terminals 64, 74," and insert --terminals 66, 74,--, therefor.

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*

14. In Column 9, Line 60, delete "terminals 64, 74." and insert --terminals 66, 74.--, therefor.

15. In Column 9, Line 64, delete "terminals 64, 74." and insert --terminals 66, 74.--, therefor.

16. In Column 9, Line 65, delete "terminals 64, 74" and insert --terminals 66, 74--, therefor.

17. In Column 10, Line 3, delete "minor" and insert --mirror--, therefor.

18. In Column 10, Line 4, delete "terminals 64, 74." and insert --terminals 66, 74.--, therefor.

19. In Column 10, Line 17, delete "terminals 64, 74" and insert --terminals 66, 74--, therefor.

20. In Column 10, Line 19, delete "first projection 66" and insert --first projection 64--, therefor.

21. In Column 10, Line 22, delete "projections 66, 70" and insert --projections 64, 70--, therefor.

22. In Column 10, Line 23, delete "terminals 64, 74" and insert --terminals 66, 74--, therefor.

23. In Column 10, Line 28, delete "first projection 66" and insert --first projection 64--, therefor.

24. In Column 10, Line 29, delete "first terminal 64" and insert --first terminal 66--, therefor.

25. In Column 10, Line 34, delete "first projection 66" and insert --first projection 64--, therefor.

26. In Column 10, Line 43, delete "first projection 66." and insert --first projection 64.--, therefor.

27. In Column 10, Line 44, delete "first projection 66," and insert --first projection 64,--, therefor.

28. In Column 10, Line 47, delete "first projection 66)," and insert --first projection 64),--, therefor.

29. In Column 10, Line 49, delete "first projection 66)," and insert --first projection 64),--, therefor.

30. In Column 10, Line 56, delete "first terminal 64" and insert --first terminal 66--, therefor.

31. In Column 10, Line 64, delete "first projection 66" and insert --first projection 64--, therefor.

32. In Column 11, Line 8, delete "first projection 66" and insert --first projection 64--, therefor.

33. In Column 11, Line 11, delete "first projection 66" and insert --first projection 64--, therefor.

34. In Column 11, Lines 12-13, delete "first projection 66" and insert --first projection 64--, therefor.

35. In Column 11, Line 19, delete "terminal abutment tab 146" and insert --terminal abutment tab 147--, therefor.

36. In Column 11, Line 21, delete "first projection 66" and insert --first projection 64--, therefor.

37. In Column 11, Line 22, delete "first projection 66" and insert --first projection 64--, therefor.

38. In Column 11, Line 38, delete "projections 66, 70" and insert --projections 64, 70--, therefor.

39. In Column 11, Lines 46-47, delete "first projection 66." and insert --first projection 64.--, therefor.

40. In Column 12, Line 1, delete "first projection 66" and insert --first projection 64--, therefor.

41. In Column 12, Line 3, delete "first terminal 64" and insert --first terminal 66--, therefor.

42. In Column 12, Line 15, delete "projections 66, 70" and insert --projections 64, 70--, therefor.

43. In Column 12, Line 18, delete "first terminal 64" and insert --first terminal 66--, therefor.

44. In Column 12, Line 33, delete "minor" and insert --mirror--, therefor.

45. In Column 14, Line 39, delete "protrusions 64, 70" and insert --projections 64, 70--, therefor.

46. In Column 14, Line 59, delete "minor" and insert --mirror--, therefor.

In the Claims

47. In Column 15, Line 67, in Claim 1, delete "walls:" and insert --walls;--, therefor.